United States Patent [19]
Luong et al.

[11] Patent Number: 5,745,008
[45] Date of Patent: Apr. 28, 1998

[54] HIGH VOLTAGE OPERATIONAL AMPLIFIER

[75] Inventors: Thien Huynh Luong, Vaud; Heinz Lehning, Nyon, both of Switzerland

[73] Assignee: Motorola, Inc., Schaumburg, Ill.

[21] Appl. No.: 662,541

[22] Filed: Jun. 13, 1996

[30] Foreign Application Priority Data

Jun. 24, 1995 [GB] United Kingdom ............... 9512948

[51] Int. Cl.$^6$ ............... H03F 3/45; H03F 1/14
[52] U.S. Cl. ............... 330/255; 330/292
[58] Field of Search ............... 330/252, 255, 330/257, 292, 300

[56] References Cited

U.S. PATENT DOCUMENTS

| | | | |
|---|---|---|---|
| 5,294,892 | 3/1994 | Ryat | 330/253 |
| 5,315,264 | 5/1994 | Sundby et al. | 330/255 |
| 5,389,894 | 2/1995 | Ryat | 330/255 X |

FOREIGN PATENT DOCUMENTS 0308079  3/1989  European Pat. Off. .

*Primary Examiner*—Steven Mottola
*Attorney, Agent, or Firm*—Rennie William Dover

[57] ABSTRACT

A high voltage operational amplifier receives a low voltage differential input signal at a low voltage transconductance stage (3) which provides a differential current output. An intermediate stage (5) has a differential current input coupled to the differential current output of the transconductance stage (3) via a voltage buffer stage (4) and produces a voltage output at a high voltage level but with low voltage swings providing a voltage representing the differential input signal. An interface stage (9) is coupled to receive the voltage output of the intermediate stage (5) and provides voltage and current outputs representing the voltage output of the intermediate stage (5). Output sourcing and sinking stages (6 and 7) receive the voltage and current outputs of the interface stage (9), respectively, and produce high currents representative of the differential input signal. The combination of the high current outputs of the output sourcing and sinking stages (6 and 7) produces a high voltage output signal at the output terminal (8).

8 Claims, 3 Drawing Sheets

000
HIGH VOLTAGE OPERATIONAL AMPLIFIER

FIELD OF THE INVENTION

This invention relates to a high voltage operational amplifier, and more particularly to a high output voltage amplifier utilizing only low voltage devices and low voltage input signals to generate high voltage output signals, which is suitable for driving electrically variable capacitors (voltage controlled capacitors).

BACKGROUND OF THE INVENTION

In usual applications requiring high output voltage amplifiers, the amplifiers are manufactured utilizing high voltage devices. This causes difficulties in trying to manufacture the amplifier in low voltage processes. These difficulties have been overcome by utilizing low voltage devices but combining them with high voltage external discrete components, which is expensive, or by using floating differential power supply devices to achieve high voltage drive capability. In U.S. Pat. No. 4,697,155, there is disclosed a high voltage amplifier having an output stage utilizing low voltage cascaded NPN Darlington transistors. However this amplifier has a saturation voltage at high voltage swings of several volts, which causes reduced amplitude swing.

Thus, it has not proved possible, and it is an object of the present invention, to provide a high output voltage operational amplifier formed solely of low voltage devices and which has low output saturation.

BRIEF SUMMARY OF THE INVENTION

Accordingly, the invention provides a high voltage operational amplifier comprising:

first and second input terminals for receiving a low voltage differential input signal;

an output terminal for providing a high voltage output signal corresponding to the low voltage differential input signal;

a low voltage transconductance stage having first and second inputs coupled to the first and second input terminals, respectively, and a differential current output;

a voltage source having a high voltage supply input and a pair of differential outputs providing a low differential voltage at a high voltage level;

intermediate stage comprising a low voltage current differential amplifier supplied by said pair of differential outputs of said voltage source and having a differential current input coupled to the differential current output of the transconductance stage and a voltage output at a high voltage level but with low voltage swings providing a voltage representing the low voltage differential input signal;

a buffer stage between the differential current input of the intermediate stage and the differential current output of the transconductance stage;

an interface stage coupled to receive the voltage output of the intermediate stage and comprising a voltage follower stage providing a voltage output representing the voltage output of the intermediate stage and a voltage to current converter stage providing a current output representing the voltage output of the intermediate stage;

an output sourcing stage having an input coupled to the voltage output of the interface stage and an output coupled to the output terminal and producing a high current representative of the low voltage differential input signal; and an output sinking stage having an input coupled to the current output of the interface stage and an output coupled to the output terminal and producing a high current representative of the low voltage differential input signal;

whereby the combination of the high current outputs of the output sourcing and sinking stages produces the high voltage output signal at the output terminal.

In a preferred embodiment, a feedback capacitor is coupled between the output terminal and the input of the interface stage. The output sourcing stage preferably comprises a plurality of cascaded PNP transistors and a control circuit coupled to the cascaded PNP transistors for controlling the voltage supplied to each transistor. The output sinking stage preferably comprises a cascode circuit having at least one NPN transistor and at least one high voltage transistor.

The buffer stage preferably comprises a high voltage transistor, such as a JFET, for each output forming the differential output of the transconductance stage. Preferably, the buffer stage includes a pair of low voltage transistors, each coupled in a cascode configuration with each of the high voltage transistors, respectively. A further high voltage transistor is preferably provided to provide a bias voltage for the low voltage transistors.

Thus, all the devices utilized in the amplifier can be formed in low voltage processes and the amplifier has low output saturation.

BRIEF DESCRIPTION OF THE DRAWINGS

Two embodiments of the invention will now be more fully described, by way of example, with reference to the drawings, of which.

DETAILED DESCRIPTION

Figure 1:
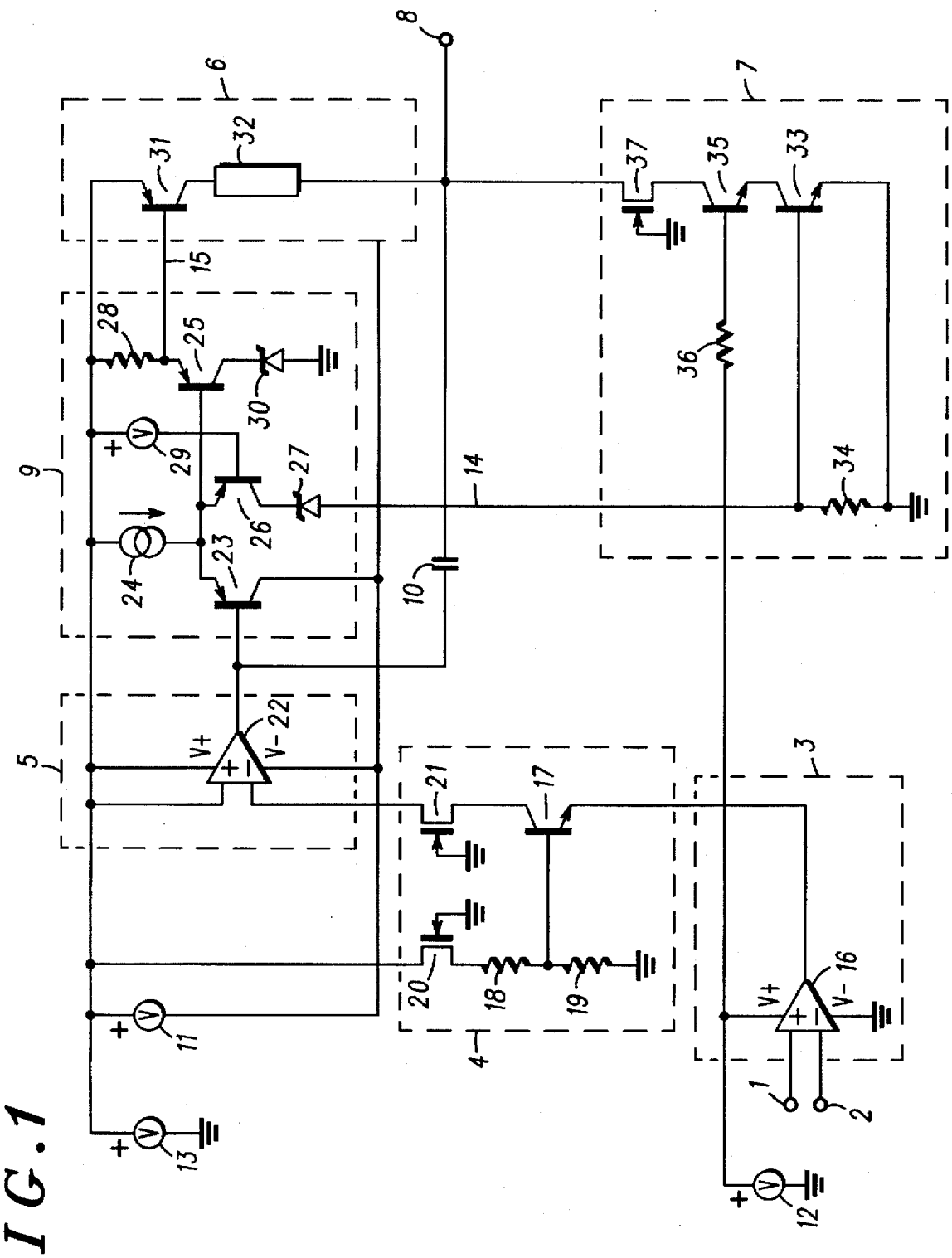
FIG. 1 shows a schematic diagram of a first embodiment of a high voltage amplifier according to the invention.

Thus, as shown in FIG. 1, one embodiment of a high output voltage amplifier includes a transconductance stage 3 coupled to receive a differential input signal having low DC bias from input terminals 1 and 2. An auto-biased voltage buffer stage 4, is coupled between the transconductance stage 3 and an intermediate current-controlled voltage source stage 5, whose output is coupled to a voltage-controlled interface stage 9 having a current output 14 and a voltage output 15. The voltage output 15 is coupled to an input of a current sourcing stage 6 and the current output 14 is coupled to a current-controlled sinking stage 7. Outputs of the current sourcing stage 6 and the current-controlled sinking stage 7 are coupled together and to an output terminal 8 of the high output voltage amplifier.

A low voltage source 12 is used to provide power for a transconductance amplifier 16 forming the transconductance stage 3. The output of the transconductance amplifier 16 is coupled to an NPN transistor 17 forming part of the buffer stage 4, the base of the NPN transistor 17 being coupled to a voltage divider network formed by resistors 18 and 19 coupled between a ground reference potential and a JFET 20 powered from a high voltage source 13. The NPN transistor 17 is coupled to a further JFET 21 to provide an output of the buffer stage 4 to a negative input of a transimpedance amplifier 22, forming part of the intermediate stage 5 and whose positive input is coupled to the high voltage source 13. The transimpedance amplifier 22 is powered from the high voltage source 13 and from a second low voltage source 11. The output of the transimpedance amplifier 22, forming the output of the intermediate stage 5, is coupled, via a Miller capacitor 10, to the output terminal 8 to provide stability.

The output of the intermediate stage 5 is also coupled to the interface stage 9 at the base of an emitter follower PNP transistor 23, whose emitter is coupled to a current source 24 and whose collector is coupled to the low voltage source 11. The emitter of transistor 23 is coupled to drive the base of a further emitter follower PNP transistor 25, whose emitter provides the voltage output 15 of the interface stage 9. A resistor 28 is coupled to the emitter of transistor 25 to polarize it and the collector of the transistor 25 is coupled to a ground reference potential via a Zener diode 30 to prevent its breakdown. The emitter of transistor 23 is also coupled to the emitter of a further PNP transistor 26 forming a differential pair, the base of the transistor 26 being coupled to a reference voltage source 29 and the collector providing, via a Zener diode 27, the current output 14 of the interface stage 9.

The voltage output 15 of the interface stage 9 is used to control a sourcing PNP transistor 31 of the current sourcing stage 6. The output of transistor 31 is passed to a complex PNP device 32, powered from the low voltage source 11, and which will be more fully described below with reference to FIG. 2, to provide the output of the sourcing stage 6.

The current output 14 of the interface stage 9 is coupled to the sinking stage 7 where it controls an NPN common emitter transistor 33 and is polarized by resistor 34. The emitter of the sinking transistor 33 is coupled to ground reference potential while its collector is coupled to the emitter of an NPN cascode transistor 35, the base of which is coupled to the low voltage source 12 via a resistor 36. The collector of transistor 35 is coupled to the source of a JFET 37, the drain of which provides the output of the sinking stage 7.

Figure 2:
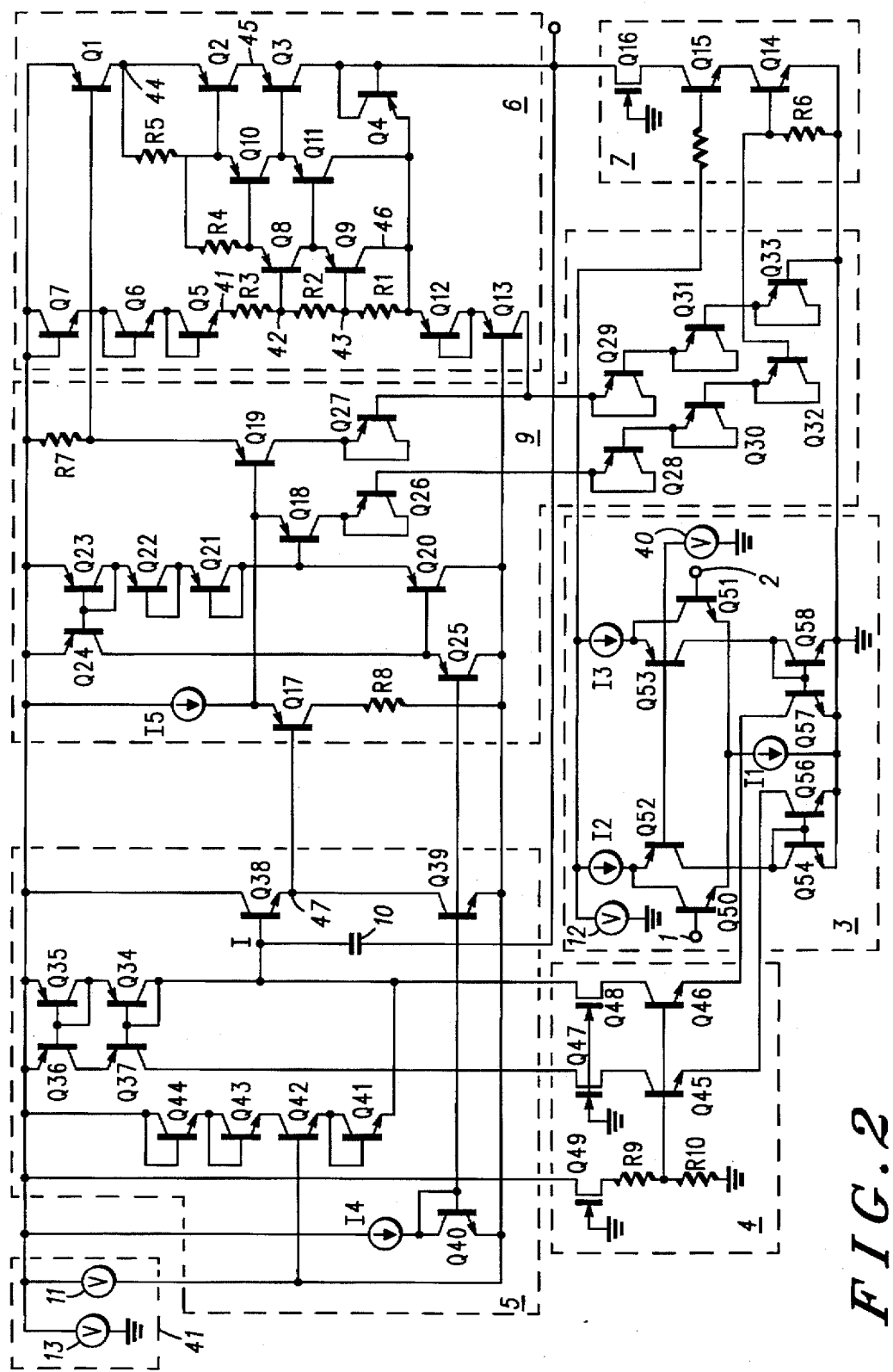
FIG. 2 shows a more detailed circuit diagram of an amplifier according to a second embodiment of the present invention.

A more detailed embodiment is shown in FIG. 2, where identical elements to those of the embodiment shown in FIG. 1 generally have the same reference numerals as in FIG. 1. In this embodiment, differential input terminals 1 and 2 are coupled respectively to the bases of transistors Q50 and Q51 of the transconductance stage 3. Their emitters, tied together and to a current source I1 from ground reference potential, form a differential pair which converts the voltage seen between input terminals 1 and 2 into an intermediate differential current at the collectors of transistors Q50 and Q51. This differential current drives the emitters of PNP cascode transistors Q52 and Q53, the bases of which are coupled to a reference voltage source 40 and the collectors of which provide a differential output current. This differential current drives two NPN current mirrors constituted by NPN transistor pairs Q54, Q56 and Q55, Q57. The currents at the collectors of transistors Q56 and Q57 provide the differential output current of the transconductance stage 3. The whole stage is supplied by current sources I2 and I3 from a low voltage source 12.

The differential output currents from the transconductance stage 3 are coupled to the respective emitters of NPN cascode transistors Q45 and Q46 of the buffer stage 4. The collectors of transistors Q45 and Q46 are coupled respectively to the sources of two cascode JFET transistors Q47 and Q48, the bases of which are grounded. The bases of transistors Q45 and Q46 are connected to a central node between resistors R9 and R10 forming an equal-voltage divider network, one end of which is connected to ground reference potential and the other end to the source of a JFET Q49. The drain of JFET Q49 is coupled to the high voltage power source 13 and its gate is grounded. Thus the resistor-divider network is driven by the JFET source. The bases of transistors Q45 and Q46 see thus half the value of the source to gate voltage ($V_{SG}$) while their collectors see all of the voltage $V_{SG}$. Consequently, half the value of voltage $V_{SG}$ appears between the collectors and bases of the transistors Q45 and Q46. This buffer stage may also be termed an auto-bias buffer stage because the voltage $V_{SG}$ is equally distributed between the output transistors Q56 and Q57 of the transconductance stage 3 and the input transistors Q45 and Q46 of the buffer stage 4. The differential output current of the buffer stage 4 is taken at the drains of the JFETs Q47 and Q48 which constitute the voltage buffer between the transconductance stage and the intermediate stage 5.

Although the voltage $V_{SG}$ of JFETs is not well defined, in this case the maximum allowed value of voltage $V_{SG}$ does not exceed twice the NPN collector-emitter breakdown voltage $V_{CE}$. For a higher voltage $V_{SG}$, a larger number of NPN transistors can be used. Consequently, the number of resistors in the divider network must be chosen appropriately.

The high voltage source 13 forms part of a power supply 41, which also includes the low voltage source 11 providing a differential reference voltage. The positive terminal of the latter is connected to the positive node of the high voltage source 13 and its negative terminal is used as a negative reference rail for the intermediate, the interface and the sourcing stages 5, 9 and 6.

The intermediate stage 5 is composed of a Wilson mirror and an emitter follower stage. The output current from the drain of the JFET Q47 of the buffer stage 4 is coupled to the base of a PNP transistor Q34, the input of the Wilson mirror. The Wilson mirror is formed by connecting a PNP current mirror (formed by transistors Q35, Q36 and Q37) between the emitter and the base of PNP transistor Q34. The PNP diode formed by transistor Q37 is provided to balance the emitter-collector voltages of PNP transistors Q35 and Q36. The output of the Wilson mirror, the collector of transistor Q34, is coupled to the drain of JFET Q48. Transistors Q41 to Q44 are used to clamp the collector of the PNP transistor Q34 to a value less than its breakdown voltage, thus preventing it from breakdown. The implementation of NPN diode Q41 in series with the emitter of transistor Q42, and NPN diodes Q43 and Q44 in series with the collector of transistor Q42 protects transistor Q42 from breakdown.

The combination of the two currents coming from the collector of transistor Q34 and the drain of JFET Q48 produces a single ended output current I. This output current I drives the base of an emitter follower NPN transistor Q38, the emitter of which is supplied by a current source sinking from the collector of an NPN transistor Q39. The base of transistor Q39 is connected to the anode of an NPN diode Q40 and its emitter, together with the cathode of diode Q40, is connected to the negative terminal of the second low voltage source 11. A current source I4 supplied from the high voltage source 13 and applied to the anode of diode Q40, is mirrored by NPN current source transistors Q39 and Q25.

The output terminal 47 of this intermediate stage 5 is taken at the emitter of transistor Q38. The emitter of NPN transistor Q38 is coupled to the base of a PNP transistor Q17 forming part of the interface stage 9. The transistor Q17 functions as an emitter follower supplied with a current from current source I5 from the high voltage source 13 and having a current limiting resistor R8 connected between its collector and the negative terminal of the low voltage source 11. The emitter of transistor Q17 drives the base of another PNP emitter follower transistor Q19 which, in its turn, drives the base of a PNP output transistor Q1 (equivalent to the sourcing transistor 31 of FIG. 1) forming part of the sourcing stage 6. The purpose of the two cascaded emitter followers Q17 and Q19, used in this interface stage 9, is to provide voltage control of the PNP output sourcing transistor Q1. The advantage of this method is that it provides a convenient way to obtain stability. A resistor R7, shunted between the emitter and the base of transistor Q1 is used to polarize the PNP transistor Q19.

The PNP transistor Q17 also forms a differential pair together with a PNP transistor Q18, the base of which is coupled to the emitter of a PNP transistor Q20 having a reference voltage. This reference voltage, provided by PNP transistors Q20, Q21, Q22, Q23 and Q24, is supplied by a current sink from the collector of the NPN transistor Q25. The collector of each of the PNP transistors Q18 and Q19 is respectively coupled to ground via four Zener diodes Q26, Q28, Q30, Q32 and Q27, Q29, Q31, Q33, respectively, which can be NPN transistors wired in a Zener configuration, to prevent breakdown of the transistors Q18 and Q19. The number of Zener diodes used depends on the value of the high voltage source 13 and the emitter-collector breakdown voltage of the PNP transistors Q18 and Q19. The current at the collector of transistor Q18 has the opposite sign to the collector current of the PNP transistor Q19 and is used to drive a sinking NPN transistor Q14 (equivalent to transistor 33 of FIG. 1) forming part of the sinking stage.

The intermediate stage 5, together with the interface stage 9, is similar to that described in U.S. Pat. No. 5,021,746.

The current from the collector of the PNP transistor Q18 passes through the four Zener diodes Q26, Q28, Q30, Q32 and reaches the current-controlled sinking stage 7 at the base of the NPN output sinking transistor Q14, which is connected in a common-emitter configuration. A resistor R0 (equivalent to resistor 34 in FIG. 1) is used to polarize transistor Q18. The emitter of transistor Q14 is grounded while its collector is coupled to the emitter of an NPN cascode transistor Q15. The base of transistor Q15 is coupled to the low voltage source 12 via resistor R6 which allows the NPN transistor Q15 to go into saturation. The collector of transistor Q15 is connected to the source of a JFET Q16, the drain of which is coupled to the output terminal 8. This JFET Q16 functions as a voltage buffer.

The low impedance voltage, from the emitter of the PNP transistor Q19 of the interface stage 9, is applied to the base of the PNP output sourcing transistor Q1. This transistor functions as a transconductance amplifier and produces a current I6 at its collector. The current I6 flows into the emitter of a PNP transistor Q2 whose collector is connected to the emitter of another PNP transistor Q3. In this manner, transistors Q2 and Q3 together pass current I6 to the output terminal 8 into a current I0. Current I0 sources a current to the load, thus creating a voltage $V_O$ relative to ground reference.

The cathode of a diode Q4 (a PNP transistor configured in diode mode) is connected to the output terminal 8, the anode of which is connected to one end of a voltage divider network formed of three equal resistors R1, R2 and R3. The other end 41 of the voltage divider network is connected, via three cascaded diodes Q5, Q6 and Q7 (NPN transistors configured in diode mode), to the high voltage source 13. Consequently, the voltage drops across the three resistors are equal to:

$$(V_{CC}-V_O-4V_{BE})/3$$

where $V_{CC}$ is the supply voltage from the high voltage source 13, $V_O$ is the output voltage and $V_{BE}$ is the base-emitter voltage drop of the diodes.

Figure 3:
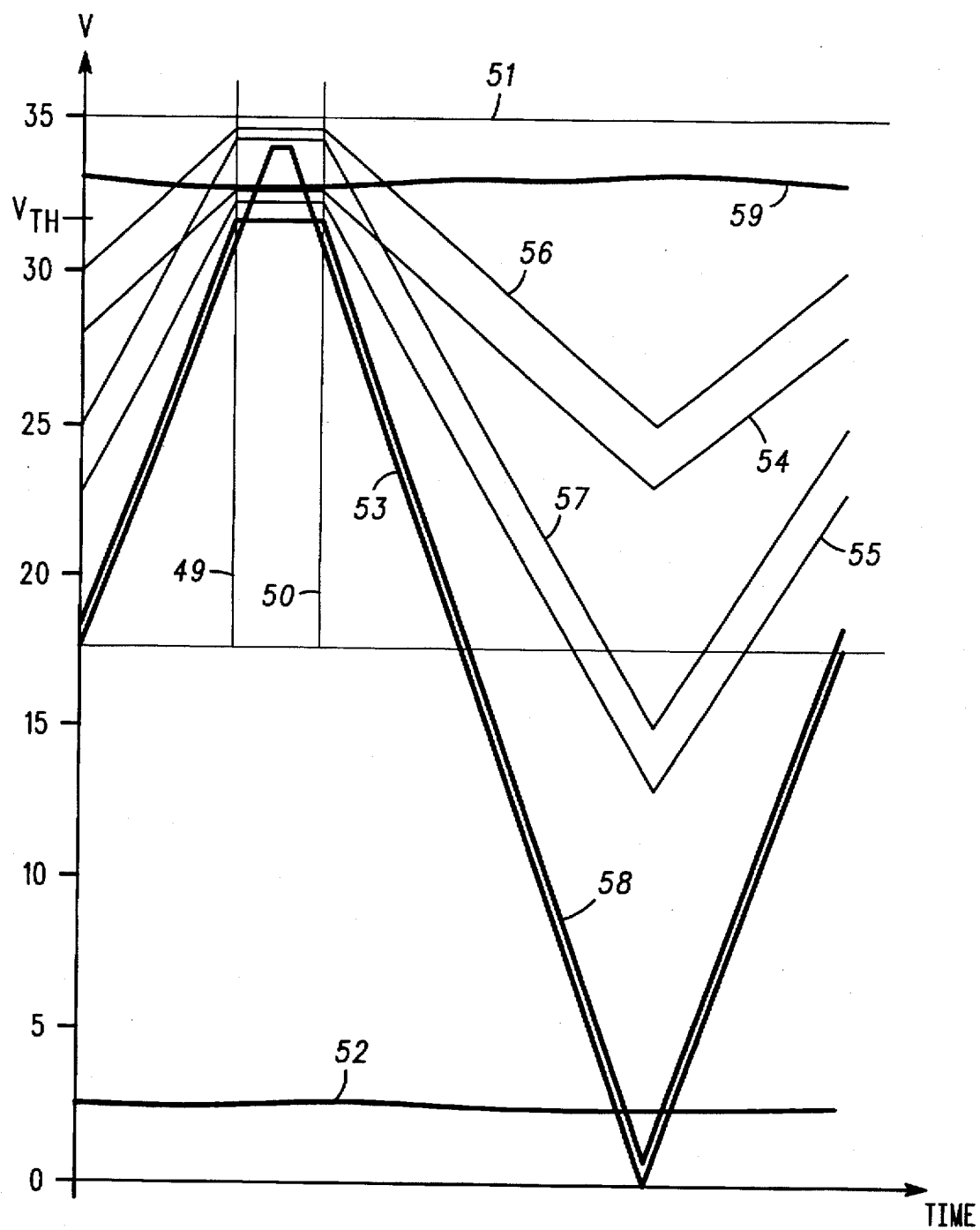
FIG. 3 shows voltage levels at various nodes in the amplifier of FIG. 2.

FIG. 3 shows the voltages at various nodes in the circuit. In particular, curve 51 represents the supply voltage $V_{CC}$ from the high voltage source 13, curve 52 represents the difference of the voltages at the input terminals 1 and 2, and curve 53 represents the output voltage $V_O$. Curves 54 and 55 represent the voltages at nodes 42 and 43, respectively, of the voltage divider network. Curves 56 and 57 represent the voltages at nodes 44, between transistors Q1 and Q2, and 45, between transistors Q2 and Q3, respectively, and curve 59 represents the voltage at the output terminal 47 of the intermediate stage 5.

The two centre nodes 42 and 43 of the voltage divider network are connected respectively to the bases of PNP transistors Q8 and Q9. The emitter of transistor Q8 is coupled to the base of transistor Q10 to form a Darlington transistor pair. In the same manner, transistors Q9 and Q11 form another PNP Darlington transistor pair, which is cascaded with the previous PNP Darlington transistor pair by connecting the respective emitters to the collectors of transistors Q8 and Q10. The outputs of these cascaded PNP Darlington pairs, taken at the emitters of transistors Q10 and Q11, drive the bases of the PNP transistors Q2 and Q3. The remaining collectors of transistors Q9 and Q11 are connected to the anode of the PNP diode Q4 to complete the loop. Resistors R4 and R5, connected respectively to the emitter-base junctions of transistors Q10 and Q2, are used to polarize the cascaded Darlington transistor pairs. Thus, the voltage drops across resistors R3, R2 and R1 are passed to the PNP transistors Q1, Q2 and Q3, respectively. In this way, the voltage seen from the emitter to the collector of each PNP is equal to:

$$(V_{CC}-V_O-4V_{BE})/3$$

When $V_O$ is equal to zero, the drops reach their maximum of $(V_{CC}-4V_{BE})/3$. Thus, in such a scheme approximately three times the PNP emitter-collector breakdown voltage can be dealt with. Of course, a higher number of PNP transistors could be chosen to enlarge the voltage capability. In this embodiment, the number three is chosen to ensure the local stability of the PNP Darlington transistor pairs. The cascaded Darlington PNP transistors Q8 to Q11 are used to boost the current to the load.

Devices Q5 to Q11 and R1 to R5 together form a control circuit, the input of which is taken at the anode of PNP diode Q4. Such a circuit has a large voltage drop between $V_{CC}$ and the output terminal 8. This situation is undesirable, so a clamp circuit is implemented to eliminate this problem. This clamp circuit is composed of a PNP transistor Q13 and a PNP diode Q12, the cathode of the latter being connected to the emitter of the former. The base of transistor Q13 is then coupled to the high voltage source 13 via the low voltage source 11 and its collector is grounded via the three Zener diodes Q29, Q31, Q33.

As shown in FIG. 3, when the output voltage $V_O$ increases beyond the threshold voltage $V_{TH}$ equal to $(V_{CC}-V_{REF}+V_{BE})$, where $V_{REF}$ is the voltage from the low voltage source 11, the clamp circuit operates to anchor the anode of the diode Q4 to ($V_{TH}+V_{BE}$), then turns it off and disconnects the output terminal 8 from the control circuit. This releases the output terminal 8, at which the voltage starts to increase until the PNP transistor Q3 reaches saturation. Curve 58 in FIG. 3 represents the voltage at node 46 at the anode of diode Q4. The threshold voltage $V_{TH}$ is chosen such that when the PNP transistor Q1 starts to saturate, the clamping function begins to operate, as shown in FIG. 3 between lines 49 and 50. This is the optimal value of $V_{TH}$, but $V_{TH}$ must be 100 mV lower to ensure the off condition of transistor Q4. The voltage between the emitter and the collector of transistor Q2 is equal to the saturation voltage $V_{SAT}$ of transistor Q1 plus $R2.I_B$, where R2 is the resistance value of resistor R2 and $I_B$ is the base current of Q8. The total output voltage drop is equal to:

$$3V_{SAT}+R2.I_B$$

The bias current at the output branch (consisting of transistors Q1, Q2, Q3, Q14, Q15 and JFET Q16) of the amplifier is governed by the equality between the junction voltages of transistors Q21, Q22, Q23 and Q18, Q19, Q1.

Finally, to insure the overall stability, a Miller capacitor 10 is coupled between the output terminal 8 and the base of the NPN transistor Q38 of the intermediate stage to compensate the amplifier frequency phase shift.

It will be appreciated that although only two particular embodiments of the invention have been described in detail, various modifications and improvements can be made by a person skilled in the art without departing from the scope of the present invention.

We claim:

1. A high voltage operational amplifier comprising:

first and second input terminals for receiving a low voltage differential input signal;

an output terminal for providing a high voltage output signal corresponding to the low voltage differential input signal;

a low voltage transconductance stage having first and second inputs coupled to the first and second input terminals, respectively, and a differential current output;

a voltage source having a high voltage supply input and a pair of differential outputs providing a low differential voltage at a high voltage level;

an intermediate stage comprising a low voltage current differential amplifier supplied by said pair of differential outputs of said voltage source and having a differential current input coupled to a differential current output of a buffer stage and a voltage output at a high voltage level but with low voltage swings providing a voltage representing the low voltage differential input signal;

the buffer stage being coupled between the differential current input of the intermediate stage and the differential current output of the transconductance stage;

an interface stage coupled to receive the voltage output of the intermediate stage and comprising a voltage follower stage providing a voltage output representing the voltage output of the intermediate stage and a voltage to current converter stage providing a current output representing the voltage output of the intermediate stage;

an output sourcing stage having an input coupled to the voltage output of the interface stage and an output coupled to the output terminal and producing a high current representative of the low voltage differential input signal; and an output sinking stage having an input coupled to the current output of the interface stage and an output coupled to the output terminal and producing a high current representative of the low voltage differential input signal;

whereby the combination of the high current outputs of the output sourcing and sinking stages produces the high voltage output signal at the output terminal.

2. A high voltage operational amplifier according to claim 1, further comprising a feedback capacitor coupled between the output terminal and the input of the interface stage.

3. A high voltage operational amplifier according to claim 1, wherein the output sourcing stage comprises a plurality of cascaded PNP transistors and a control circuit coupled to the cascaded PNP transistors for controlling the voltage supplied to each transistor.

4. A high voltage operational amplifier according to claim 1, wherein the output sinking stage comprises a cascode circuit having at least one NPN transistor and at least one high voltage transistor.

5. A high voltage operational amplifier according to claim 1, wherein the buffer stage comprises a high voltage transistor for each output forming the differential output of the transconductance stage.

6. A high voltage operational amplifier according to claim 5, further comprising a pair of low voltage transistors, each coupled in a cascode configuration with each of the high voltage transistors of the buffer stage, respectively.

7. A high voltage operational amplifier according to claim 6, further comprising a further high voltage transistor coupled to each of the high voltage transistors of the buffer stage to provide a bias voltage for each of the pairs of low voltage transistors.

8. A high voltage operational amplifier according to claim 1, wherein all the devices utilized in the amplifier are formed in one or more low voltage processes.

* * * * *